US009261926B2

(12) United States Patent
Larsen et al.

(10) Patent No.: US 9,261,926 B2
(45) Date of Patent: Feb. 16, 2016

(54) THERMALLY ACTUATED VENTS FOR ELECTRONIC DEVICES

(71) Applicant: Intel Corporation, Santa Clara, CA (US)

(72) Inventors: Denica N. Larsen, Hillsboro, OR (US); Prosenjit Ghosh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 294 days.

(21) Appl. No.: 13/931,881

(22) Filed: Jun. 29, 2013

(65) Prior Publication Data
US 2015/0003008 A1 Jan. 1, 2015

(51) Int. Cl.
*H05K 7/20* (2006.01)
*G06F 1/20* (2006.01)
*H01L 23/473* (2006.01)

(52) U.S. Cl.
CPC ............ *G06F 1/203* (2013.01); *H05K 7/20181* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; F24F 13/08
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| 4,429,545 | A | | 2/1984 | Steinberg |
| 4,821,147 | A | * | 4/1989 | Jacobs ............... H05K 7/20545 211/41.17 |
| 5,107,916 | A | | 4/1992 | van Roermund et al. |
| 5,528,455 | A | | 6/1996 | Miles |
| 5,769,159 | A | | 6/1998 | Yun |
| 5,773,755 | A | | 6/1998 | Iwatare |
| 6,016,250 | A | | 1/2000 | Hanners |

(Continued)

FOREIGN PATENT DOCUMENTS

| JP | 01074799 | 3/1989 |
| JP | 04099399 | 3/1992 |
| JP | 04230097 | 8/1992 |

OTHER PUBLICATIONS

Final Office Action mailed Jun. 18, 2015, in U.S. Appl. No. 12/635,666, 16 pages.

(Continued)

*Primary Examiner* — Anthony Haughton
*Assistant Examiner* — Razmeen Gafur
(74) *Attorney, Agent, or Firm* — Blakely, Sokoloff, Taylor & Zafman LLP

(57) ABSTRACT

Thermally actuated vents for electronic devices. An embodiment of an apparatus includes a vent having a first position and a second position, wherein the first position is an open position and the second position is a closed position; a muscle wire, a first end of the muscle wire being coupled with a connection to the vent and a second end of the muscle wire being coupled with an anchor point; and a tension element, a first end of the tension element being coupled with the vent at a connection point. The muscle wire is to apply a force to the vent to move the vent to the open position upon the muscle wire entering a contracted state, and the tension element pulling the vent to the closed position upon the muscle wire entering a relaxed state.

24 Claims, 7 Drawing Sheets

(56) References Cited

U.S. PATENT DOCUMENTS

| | | | |
|---|---|---|---|
| 6,047,836 A | 4/2000 | Miles | |
| 6,229,701 B1 | 5/2001 | Kung et al. | |
| 6,278,607 B1 | 8/2001 | Moore et al. | |
| 6,330,155 B1 | 12/2001 | Remsburg | |
| 6,330,157 B1 | 12/2001 | Bezama et al. | |
| 6,372,378 B1 | 4/2002 | Warner et al. | |
| 6,628,522 B2 | 9/2003 | Trautman et al. | |
| 7,031,154 B2 | 4/2006 | Bash et al. | |
| 7,079,387 B2 | 7/2006 | Brooks et al. | |
| 7,187,561 B2* | 3/2007 | Chang | G06F 1/20 361/679.01 |
| 7,247,089 B2 | 7/2007 | Crippen et al. | |
| 7,290,401 B2 | 11/2007 | Hermerding | |
| 7,715,193 B1* | 5/2010 | Ye | H05K 7/20145 312/236 |
| 7,740,965 B2 | 6/2010 | Richards et al. | |
| 7,778,029 B2 | 8/2010 | Ueno | |
| 7,990,703 B2* | 8/2011 | Tang | G06F 1/1616 248/688 |
| 8,164,897 B2* | 4/2012 | Graybill | H05K 7/20745 361/679.48 |
| 8,218,313 B2* | 7/2012 | Cheng | G06F 1/166 248/188.2 |
| 8,369,084 B2* | 2/2013 | Chen | G06F 1/203 361/679.47 |
| 8,408,981 B2 | 4/2013 | Su et al. | |
| 8,767,391 B2* | 7/2014 | Jin | H05K 7/20563 312/236 |
| 2001/0020545 A1* | 9/2001 | Eldridge | B23K 20/004 174/260 |
| 2004/0217072 A1* | 11/2004 | Bash | H05K 7/20736 211/26 |
| 2004/0228086 A1* | 11/2004 | Lin | G06F 1/203 361/679.48 |
| 2005/0058887 A1 | 3/2005 | Richards et al. | |
| 2005/0088817 A1* | 4/2005 | Ou Yang | H05K 7/20181 361/695 |
| 2005/0168942 A1 | 8/2005 | Steinbrecher | |
| 2005/0168945 A1 | 8/2005 | Coglitore | |
| 2005/0286225 A1 | 12/2005 | Moore et al. | |
| 2006/0148399 A1* | 7/2006 | Su | G06F 1/20 454/184 |
| 2006/0270332 A1 | 11/2006 | Kober et al. | |
| 2007/0053143 A1* | 3/2007 | Kang | G06F 1/203 361/678 |
| 2007/0072541 A1 | 3/2007 | Daniels et al. | |
| 2007/0171609 A1 | 7/2007 | Kehl et al. | |
| 2008/0198505 A1* | 8/2008 | Chuang | G06F 1/1632 360/98.01 |
| 2008/0205004 A1 | 8/2008 | Ueno | |
| 2008/0212280 A1 | 9/2008 | Yamanaka | |
| 2009/0020618 A1 | 1/2009 | Gutierrez et al. | |
| 2009/0021908 A1 | 1/2009 | Patel et al. | |
| 2009/0086423 A1 | 4/2009 | Mongia et al. | |
| 2009/0215380 A1* | 8/2009 | Lin | F04D 25/0613 454/184 |
| 2009/0323274 A1* | 12/2009 | Lin | G06F 1/18 361/679.48 |
| 2010/0041327 A1* | 2/2010 | Desler | F24F 1/0007 454/184 |
| 2010/0128433 A1* | 5/2010 | Harwood | H05K 7/20545 361/690 |
| 2010/0226088 A1* | 9/2010 | Huang | G06F 1/203 361/679.48 |
| 2011/0103007 A1* | 5/2011 | Kao | G06F 1/206 361/679.48 |
| 2011/0128704 A1* | 6/2011 | Chang | H05K 7/20727 361/697 |
| 2011/0157822 A1* | 6/2011 | Wu | G06F 1/181 361/695 |
| 2011/0256823 A1 | 10/2011 | Ludmann | |
| 2011/0299245 A1* | 12/2011 | Liang | F04D 29/582 361/692 |
| 2012/0300400 A1* | 11/2012 | Tsai | G06F 1/20 361/695 |

OTHER PUBLICATIONS

Office Action mailed Jul. 11, 2014, in U.S. Appl. No. 12/635,666, 11 pages.

Office Action mailed Jul. 17, 2013, in U.S. Appl. No. 12/635,666, 10 pages.

Office Action mailed Nov. 5, 2014, in U.S. Appl. No. 12/635,666, 16 pages.

* cited by examiner

THERMALLY ACTUATED VENTS FOR ELECTRONIC DEVICES

TECHNICAL FIELD

Embodiments described herein generally relate to the field of electronic devices and, more particularly, to thermally actuated vents for electronic devices.

BACKGROUND

In electrical devices, including devices such as, for example, laptop and notebook computers, the generation of excess heat by processors and other electronic elements requires cooling to prevent damage to the circuit elements, reduce discomfort of users, and otherwise address problems that arise with excess heat. Cooling devices and processes may be active or passive, and may greatly vary in sophistication.

Any cooling process must provide one or more means for allowing the excess heat to escape or be pushed out of the electronic device, including vents to allow the discharge of heated air. However, open vents are contrary to a sleek product design, and such vents can allow dust and other foreign material to enter the casing of an electronic device.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
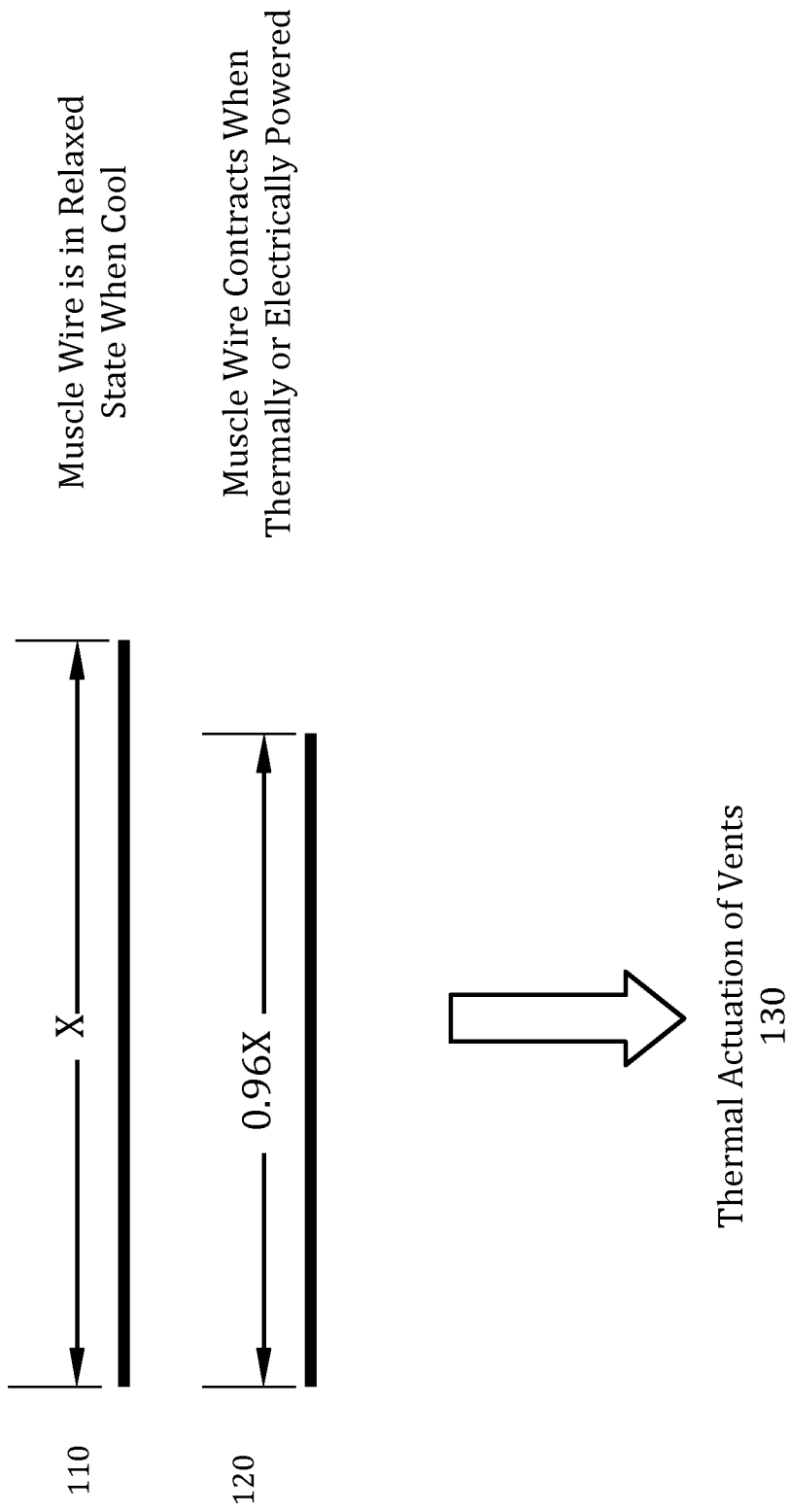
FIG. 1 is an illustration of operation of muscle wire for thermal actuation of vents in an embodiment.

Embodiments described herein are generally directed to thermally actuated vents for electronic devices.

Current trends for electronic apparatus or system design, such as notebook computer design, including Ultrabook™, is to eliminate or minimize venting to achieve a clean and sleek ID (Industrial Design) look. Unfortunately, this design results in a reduction in the system's thermal capability by reducing the amount of heat that can be expelled from the apparatus or system.

Conventional mobile devices, such as notebook or laptop computers, often minimize venting, and thus result in either reduced cooling capacity or a need for an expensive, high performance thermal solution. As used herein, "mobile device" means a mobile electronic device or system including a laptop or notebook computer, Ultrabook, tablet computer, cellular phone, smart phone, mobile Internet device (MID), handheld computers, personal digital assistants (PDAs), and other similar devices.

In some embodiments, an electronic apparatus or system, including a mobile device, includes thermally actuated venting, which may be used to provide a clean design without open venting while not compromising thermal performance of the apparatus or system. In some embodiments, an apparatus or system includes a muscle wire, composed of material from a shape memory alloy (SMA) family, to control and actuate the venting of the apparatus or system in response to heating of the muscle wire.

Conventional apparatuses and systems commonly include static venting, where vents, if such vents exist, have certain fixed openings. In some embodiments, vents are dynamically operated, such as, for example, dynamic operation of vent louvers and other vent covers, such that vent openings open and close in response to thermal conditions. In some embodiments, muscle wire is utilized to automatically trigger the opening of the vents, thus providing thermally actuated vents. As used herein, the opening or closing of a vent includes the movement of a vent cover to expose or cover vent openings, or any other manner of opening or closing a vent.

As used herein, "muscle wire" means a wire that is composed of a shape memory alloy material. By its inherent nature, muscle wire contracts when it is heated, including by applying heat to the muscle wire or applying an electrical potential to run a current through the muscle wire, and then expands to its previous size when the muscle wire cools after the heat or electrical potential is removed. Muscle wire may include Nitinol material, referring to a nickel titanium alloy that includes the ability to contract when heat or an electrical current is applied to the wire. For Nitinol wire an activation temperature (referred to as the transition temperature) is 158 degrees F. (70 degrees C.). As used herein, "wire" refers to material in a form having a width or diameter that is significantly smaller than a length of the material. Stated in another way, if the length is defined as the Z-axis of the wire, then the size of the wire in the X-axis and the Y-axis is significantly smaller than the length in the Z-axis. While a cross-section of a wire that is perpendicular to the length of the wire is commonly round, embodiments are not limited to this shape of wire, and may include wires with, for example, a cross-section that is shaped as a square, rectangular, or other polygon, as an elliptical shape, or as a flat (or tape) shape. Muscle wire diameter can be in the range of 0.025 mm, and is light, acoustically quiet, and generally consumes little or no power. Thus, muscle wire is particularly suitable for tight physical space and power consumption constraints.

In some embodiments, a muscle wire is attached at a first end (where the attachment may be via one or more intervening elements) to a vent connection, where a vent connection is a physical connection that provides for opening of a vent of an electronic apparatus or system, such as moving one or more vent covers from a first position (which may be referred to as a closed position) to a second position (which may be referred to as an open position), including, but not limited to, opening one or more vent louvers, when a force is applied in a first direction. In some embodiments, the muscle wire is attached (where the attachment may be via one or more intervening elements) to an anchor, the anchor being any fixed point or element in an apparatus or system. In some embodiments, upon the muscle wire rising in temperature above the transition temperature by the wire being thermally or electrically charged, the muscle wire responds by contracting and applying force to the vent connection, and thus moving the vent to an open position. In some embodiments, upon the thermal or electrical charging being removed from the muscle wire, the muscle wire expands back to its original length. In some embodiments, a thermal actuation mechanism includes a spring or other tension element that is connected to the vent either at the vent connection or a second vent connection that provides a force in a direction to cause the mechanism to move the vent to a closed position, the tension element acting to return the vent to the closed position. As used here, an "open position" refers to a state in which a vent is open a greater amount than in a "closed position". In some implementations an open position may provide a fully open vent opening and a closed position may include a fully closed vent opening, but embodiments are not limited to these positions or states. For example, in some embodiments a vent may be allowed to remain partially open in the closed position.

In this manner, a muscle wire provides for a thermal actuator for a vent of an electronic apparatus of system without requiring heat sensing or cooling control for the operation. In some embodiments, a muscle wire is thermally charged by placing the wire in contact with or in close proximity to a heat source, where a heat source is either an element that produces heat, such a processor, memory, or other electronic device, or an element that conducts heat from one or more other elements, such as a cooling fin. However, embodiments are not limited to an apparatus or system in which the muscle wire is in contact with or close proximity to a heat source. For example, in some implementations ambient temperatures in an apparatus or system may be sufficient to contract the muscle wire without the muscle wire being in close proximity to a heat source.

In some embodiments, a muscle wire may additionally be caused to contract by electrically charging the muscle wire, the resulting electric current causing heating of the wire and a transition to a contracted state upon reaching a transition temperature. In some embodiments, the electrical charging of the muscle wire may be implemented under certain circumstances to quickly open one or more vents without waiting for thermal conditions to reach a high enough temperature. In some embodiments, electrical charging may be in response to a cooling controller, which may in some instances be a general-purpose processor and in other instances may be a separate controller. In some embodiments, the electrical charging of the muscle wire may be imposed in response to a state of a heat sensor. For example, a system or apparatus may activate the electrical charging of the muscle wire upon system temperature reaching a certain temperature threshold, the temperature causing the apparatus or system to send a signal to electrically charge the muscle wire to trigger such muscle wire to contract and fully open the vents quickly.

FIG. 1 is an illustration of operation of muscle wire for thermal actuation of vents in an embodiment. In this illustration, a muscle wire 110 is in a first relaxed state when the wire is cool, where cool refers to a temperature below a transition temperature of the muscle wire. In the relaxed state the wire is a certain first length X. As further shown in FIG. 1, when the muscle wire 120 is thermally or electrically charged to a temperature at or above a transition temperature for the muscle wire, then the wire transitions to a second contracted state. (The amount of contraction is not drawn to scale.) In the contracted state the wire is a certain second length, the second length being shorter than the first length. The actual amount of contraction will depend on the precise molecular composition of the muscle wire. In this example the muscle wire has contracted to 0.96X in length, thus having lost 4 percent of the overall length of the wire. Upon cooling, the muscle wire will return to the relaxed state, returning to a length X.

In some embodiments, the thermal contraction of the muscle wire is utilized to provide thermal actuation of vents of an apparatus or system 130. In some embodiments, the muscle wire is attached with a vent, and the contraction of the muscle wire with application of heat or an electrical current causes the muscle wire to move the vent from a first position (a closed position) to a second position (an open position), and upon cooling the muscle wire the vent returns to the closed position.

Figure 2:
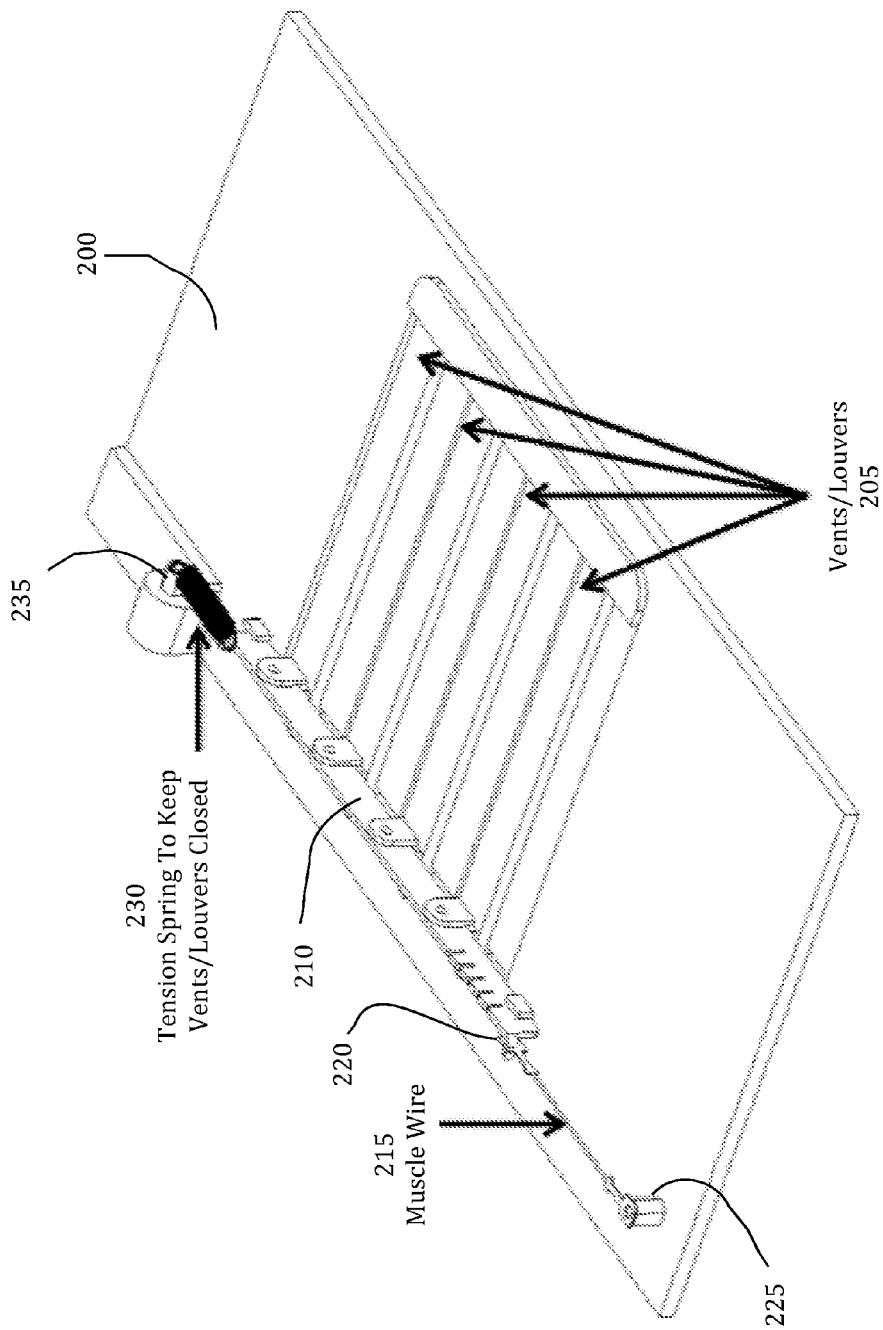
FIG. 2 is an illustration of an embodiment of an apparatus with thermally actuated vents in a closed position.

FIG. 2 is an illustration of an embodiment of an apparatus with thermally actuated vents in a closed position. In some embodiments, an electronic apparatus or system includes a cover 200, the cover including one or more vents with vent covers 205 that are operable to being opened and closed. In an example, a vent may include multiple louvers that are opened and closed, but embodiments are not limited to this particular vent design. In some embodiments, the one or more vents are thermally actuated by one or more muscle wires, such as muscle wire 215. In some embodiments, a first end of the muscle wire 215 is attached with the vent (which may be via one more intervening elements) at a vent connection point 220. In FIG. 2, the vent connection 220 is a connection to a bar 210 that is in turn connected to each of the vent louvers such that the louvers are controlled together. As illustrated in FIG. 2, the muscle wire 215 is in a relaxed state. While FIG. 2 and other figures herein illustrate a single muscle wire for simplicity in illustration, embodiments are not limited to a structure with a single muscle wire for a vent, and may include multiple muscle wires to activate a vent depending on the implementation. If an embodiment includes multiple muscle wires, the wires may includes wires that are connected to a single point or to multiple points of a vent, and that aligned in a same direction or in different directions, depending on, for example, the structure of the apparatus and the vent.

In some embodiments, a second end of the muscle wire 215 is connected to an anchor point 225, the anchor point allowing the contraction of the muscle wire to apply force to the vent connection 220. In some embodiments, the vent is further connected with a first end of a spring or other tension element 230, with a second end of the spring being connected to an anchor point 235 such that the tension from the spring operates to hold the vent 205 in a closed position when the muscle wire 215 is in a relaxed state.

While not illustrated in FIG. 2, in some embodiments the electronic apparatus or system further includes a vent activator to apply energy to the muscle wire to activate the muscle wire. In some embodiments, the vent activator includes one or more heat sources to provide thermal energy to the muscle wire, where the muscle wire 215 may be in contact with or in close proximity to a heat source. In some embodiments, the muscle wire 215 may further include an electrical connection for electrical charging of the muscle wire, wherein a vent activator provides electrical energy to the muscle wire via the electrical connection. While one side of the cover 200 is illustrated in FIG. 2, the cover 200, which may include multiple interconnected pieces, may fully enclose the electronic apparatus or system.

Figure 3:
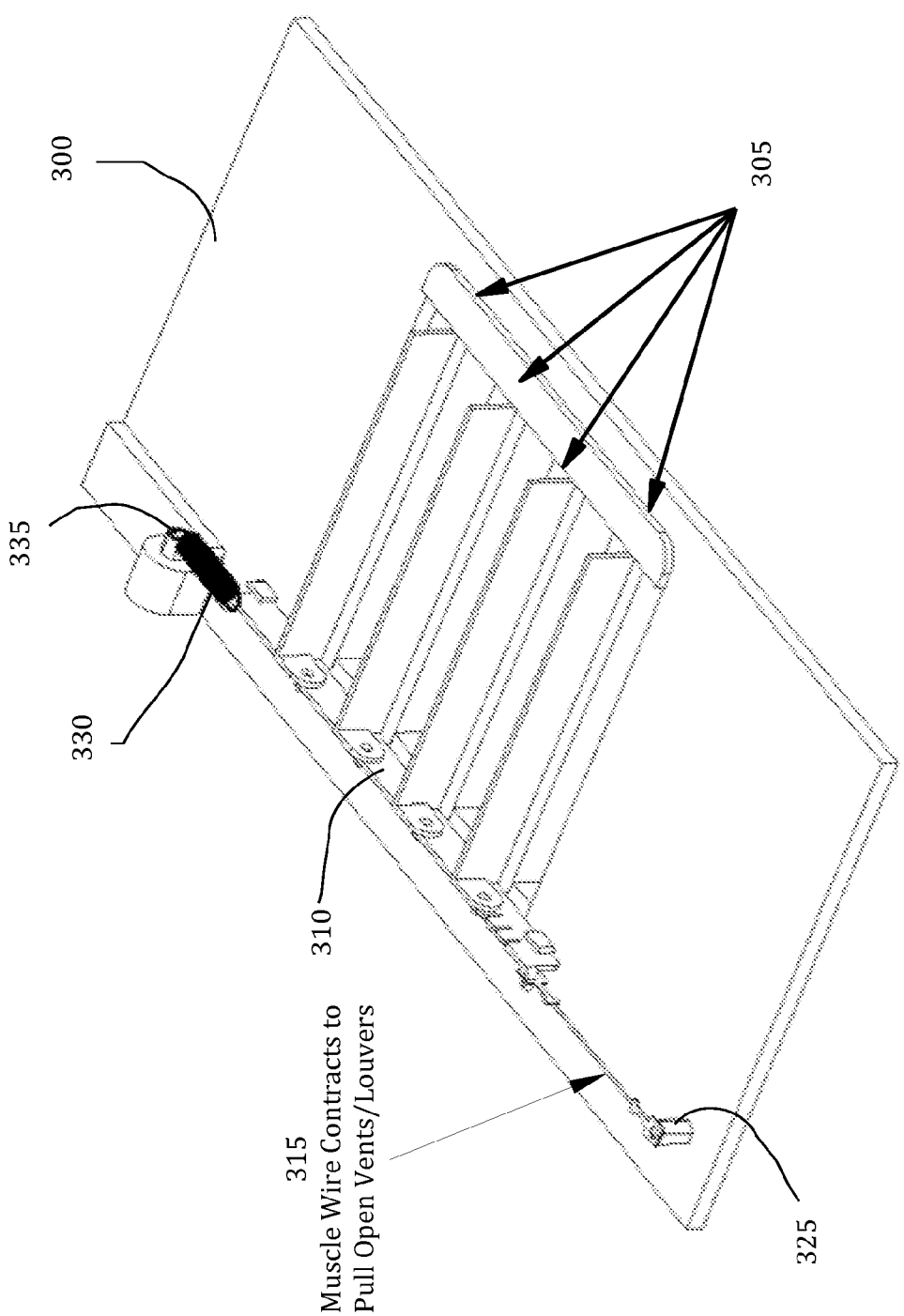
FIG. 3 is an illustration of an embodiment of an apparatus with thermally actuated vents in an open position.

FIG. 3 is an illustration of an embodiment of an apparatus with thermally actuated vents in an open position. In this illustration, an electronic apparatus or system includes a cover 300 including one or more vents with vent covers 305 that are operable to being opened and closed, such as the illustrated louvers. As illustrated, the one or more vents are thermally actuated by one or more muscle wires, such as muscle wire 315, with a first end of the muscle wire 315 being attached with the vent at vent connection point 320 (on bar 310) and a second end of the muscle wire 315 being connected to anchor point 325, the vent being further connected with a first end of spring or other tension element 330, with a second end of the spring being connected to anchor point 335.

As illustrated in FIG. 3, muscle wire 315 is in a contracted state, the muscle wire 315 being heated by thermal conditions or electrical charging, to cause the transition to the contracted state. In contracting the muscle wire 315 has applied force to the vent connection point 320 in the direction of the anchor point 315, or, stated in another way, in a Z-axis direction away from the vent. With the application of the contraction force, the bar moves to open the vent louvers 305, thus providing additional ventilation for the electronic apparatus or system. The force further pulls against the spring or other tension element 330. Upon the muscle wire 315 cooling by reduction in heat application or removal of the electrical charge from the muscle wire, the muscle wire will return to a relaxed state, such as illustrated in FIG. 2, causing the force on the vent connection point 320 to be reduced, and thus allowing the spring or other tension element 330 to pull the vent covers 305 back to a closed position.

Figures 4A, 4B:
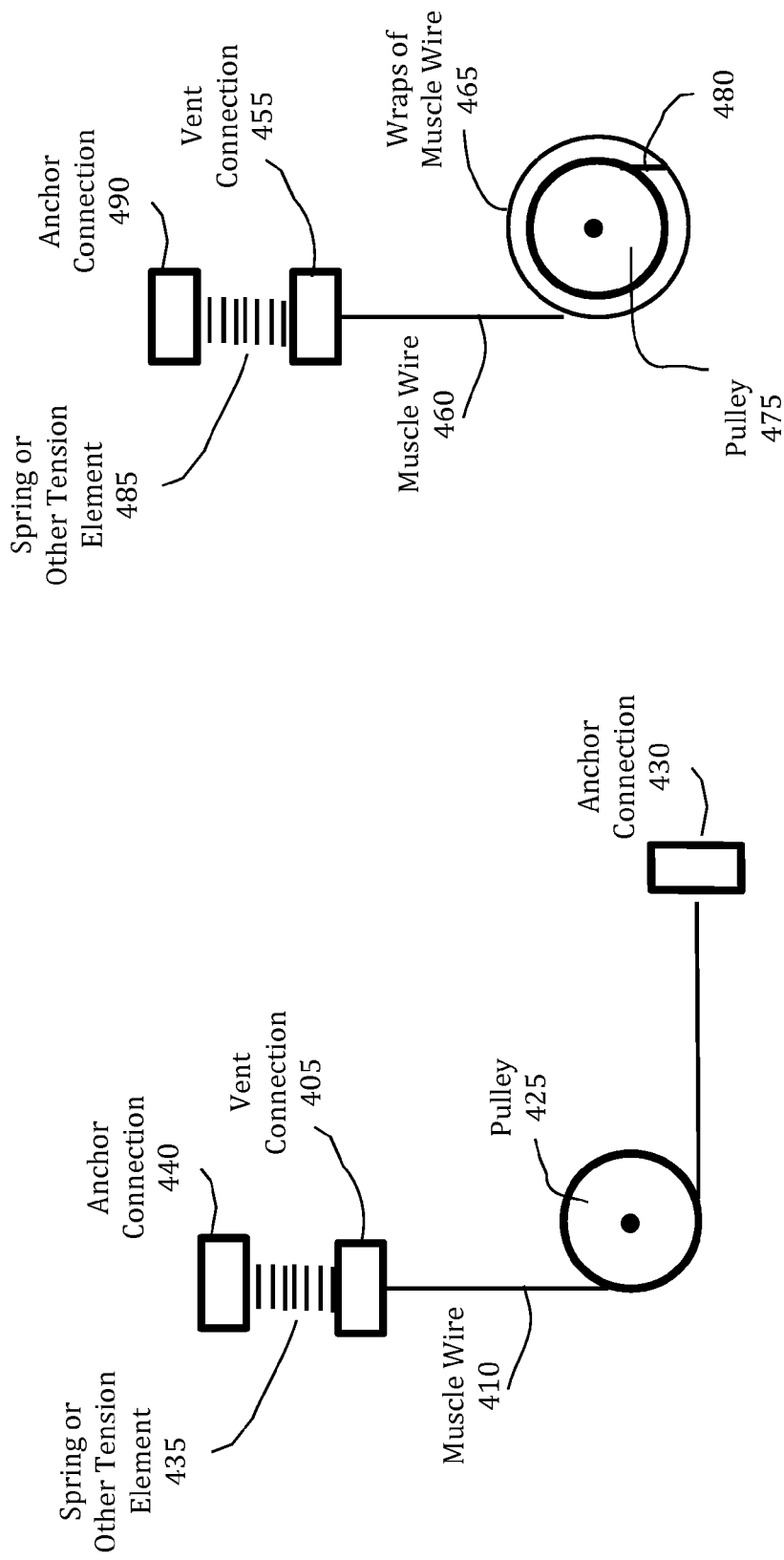
FIGS. 4A and 4B illustrate embodiments of thermally actuated vent mechanisms including a non-linear wire path.

FIGS. 4A and 4B illustrate embodiments of thermally actuated vent mechanisms including a non-linear wire path. While FIGS. 2 and 3 illustrate a muscle wire that is in a linear path, embodiments are not limited to this arrangement, and may include varied muscle wire arrangements to, for example, reduce the amount of space required for a thermally actuated vent.

In FIG. 4A, a muscle wire 410 is connected at a first end to a vent connection 405 for opening and closing one or more vent openings (not illustrated in this drawing). The vent is further connected to a spring or other tension element 435, secured to anchor connection 440, to return the vent to a closed position when the muscle wire 410 is in a relaxed state. In this embodiment, in order to reduce a linear dimension of the thermally actuated vent mechanism, the muscle wire is run around one or more pulleys 425 (or other elements to redirect the path of the muscle wire), with a second end of the muscle wire 410 being connected to anchor point 430.

In FIG. 4B, a muscle wire 460 is connected at a first end to a vent connection 455 for opening and closing one or more vent openings (not illustrated in this drawing). The vent is further connected to a spring or other tension element 485, secured to anchor connection 490, to return the vent to a closed position when the muscle wire 460 is in a relaxed state. In this embodiment, in order to further reduce a linear dimension of the thermally actuated vent mechanism, the muscle wire is wound around a pulley 475 or similar element with a second end of the muscle wire 460 being connected to anchor point 480.

While FIGS. 4A and 4B illustrate two possible non-linear arrangements for a thermally actuated vent mechanism, embodiments are not limited to these two examples, and the muscle wire may be arranged otherwise to redirect the path of the muscle wire and thus reduce the size of the mechanism in one or more dimensions.

Figure 5:
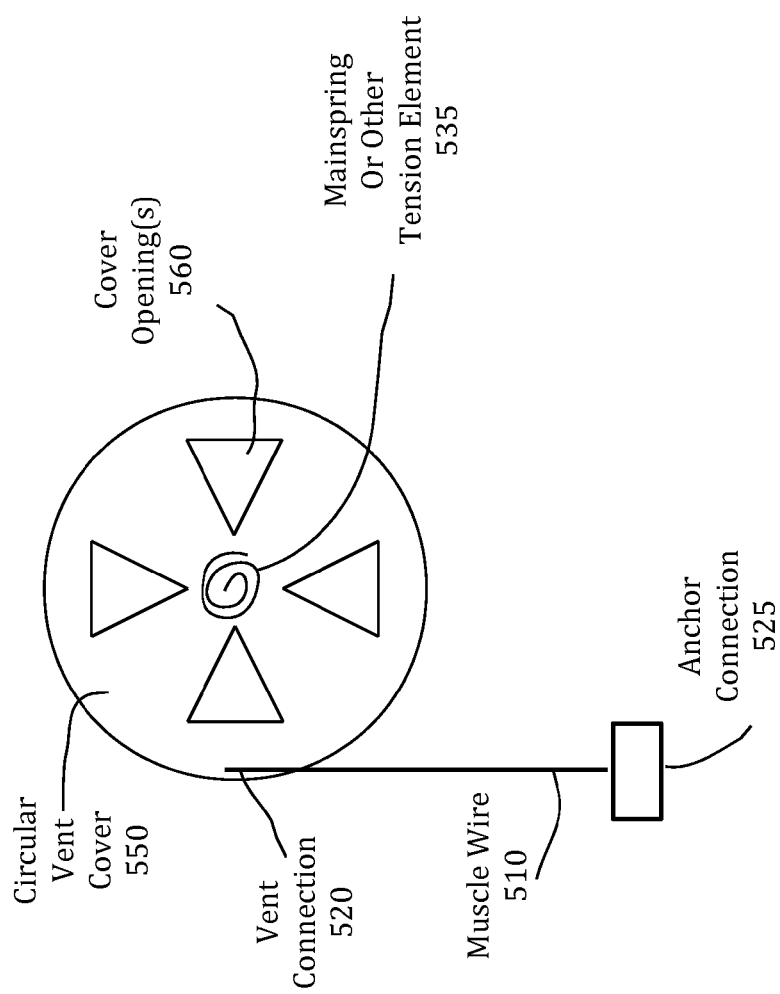
FIG. 5 is an illustration of an embodiment of a thermally actuated vent mechanism for a circular vent.

FIG. 5 is an illustration of an embodiment of a thermally actuated vent mechanism for a circular vent. While FIGS. 2 and 3 illustrate vent covers in the form of vent louvers, embodiments are not limited to this vent design, and may include any vent with an opening that can be engaged through the application of a force.

FIG. 5 illustrates an embodiment of a thermally actuated vent mechanism connected to a circular vent cover 550 that includes one or more cover openings 560. In this illustration, the circular vent cover 550 operates to open and close the vent by rotating, with the vent being in an open position when the vent cover 550 is rotated such that the cover openings 560 are in alignment with vent openings (which may of the same shape as the cover openings), and the vent being in an closed position when the vent cover 550 is rotated such that the cover openings 560 are not in alignment with the vent openings. In some embodiments, a first end of a muscle wire 510 is connected to the vent cover 550 at a vent connection 520, the muscle wire being aligned such that application of a force at vent connection 520 causes the circular vent cover to rotate (counterclockwise in the illustration). In a variant of the example shown in FIG. 5 the muscle wire 510 may be wound at least partially around the circular vent cover. As illustrated, a second end of the muscle wire 510 is coupled with an anchor connection 525. In some embodiments, the circular vent cover includes a tension element, such as mainspring or other similar element, to apply a counter force in a direction to move the vent cover to a closed position (a clockwise direction in FIG. 5).

Figure 6:
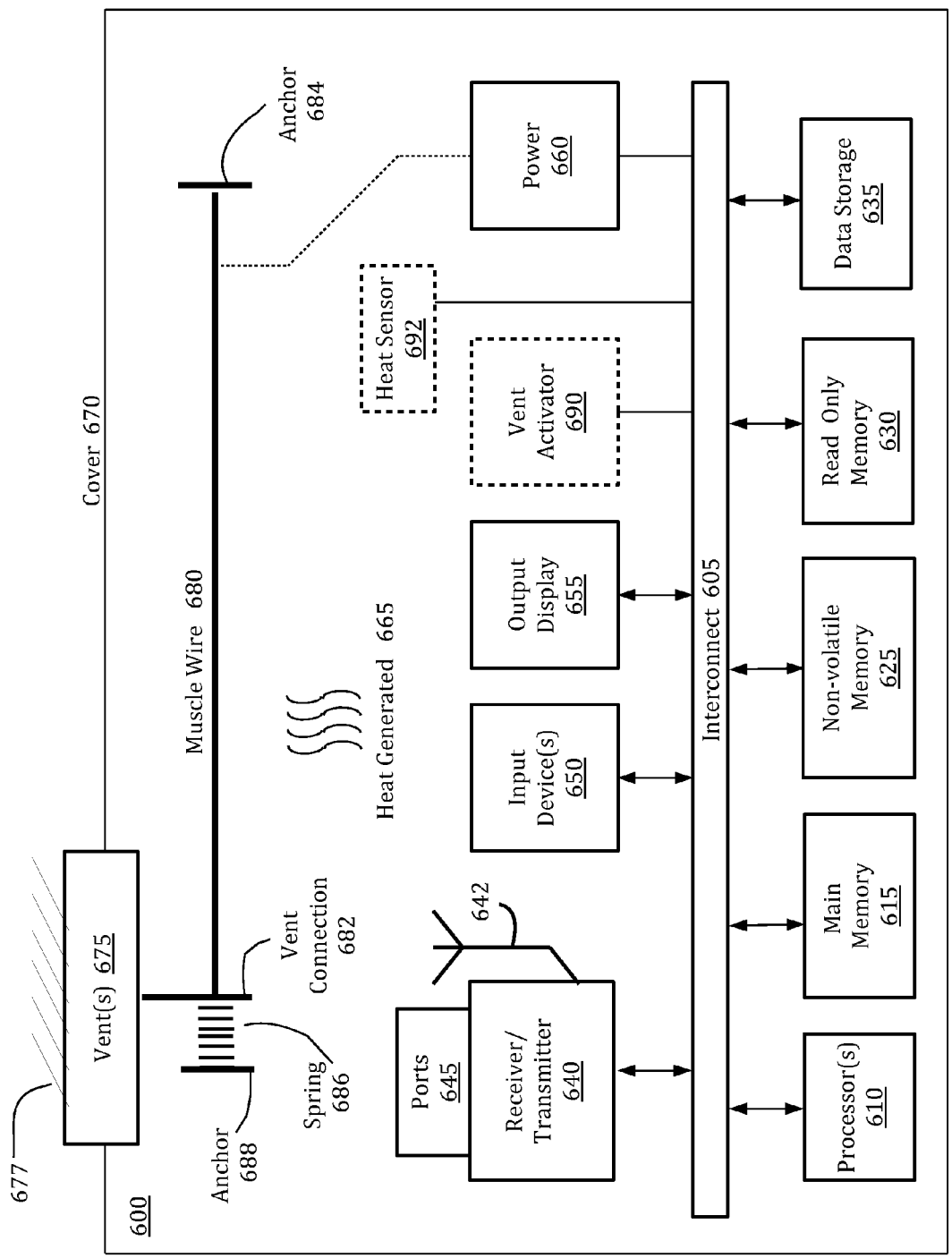
FIG. 6 illustrates an embodiment of an electronic apparatus or system including thermal vent actuation.

FIG. 6 illustrates an embodiment of an apparatus or system including thermal vent actuation. In some embodiments, an apparatus or system (referred to herein generally as a apparatus) 600 includes a thermally actuated vent mechanism, the thermally actuated vent mechanism operating to open and close a vent in response to thermal conditions.

In this illustration, certain standard and well-known components that are not germane to the present description are not shown. In some embodiments, the apparatus 600 includes a cover 670, which may completely enclose the apparatus 600, the cover 670 including one or more vents 675, a vent including openings that may be opened or closed such as by a cover or other mechanism (such as the illustrated louvers 677) that can be moved between a closed position and an open position. In some embodiments, the apparatus 600 includes a muscle wire 680 to provide thermal activation of the vent 675, wherein one end of the muscle wire 680 is coupled with a vent connection 682 and a second end of the muscle wire 680 is coupled with an anchor 684, the muscle wire 680 to provide a force on the vent connection to move the vent 675 to an open position when the muscle wire is in a contracted state. While the illustration provides a linear arrangement for the muscle wire, embodiments are not limited to this implementation, and may, for example, be structured as shown in FIG. 4A or 4B.

The apparatus 600 further includes a spring or other tension element 686 connected to a vent connection (for simplicity shown in this illustration to be the same connection 682 as the muscle wire) and to an anchor 688, the spring 686 to move the vent 675 to a closed position when the muscle wire 680 returns to a relaxed state. In some embodiments, the muscle wire 680 is activated by heat 665 provided by one or more heat sources in the apparatus.

In some embodiments, the apparatus 600 includes one or more vent activators to provide energy to the muscle wire 680 to activate the contraction of the muscle wire. In some embodiments, the vent activator may be one or more of the other illustrated components of the apparatus, and in some embodiments the vent activator may be a separate component, such as the illustrated vent activator 690.

In some embodiments, the vent activator 690 is a heat source that provides thermal energy, such as the illustrated heat generated 665, wherein the application of the thermal energy to the muscle wire 680 acts to activate the contraction of the muscle wire. The vent activator may be a processor 610, memory 615, or other component generating heat in operation, or may be a combination or any or all of the components of the apparatus 600.

In some embodiments, the vent activator 690 is one or more components to apply electrical energy to the muscle wire 680 to activate the contraction of the muscle wire. In some embodiments, the muscle wire 680 is activated by application of an electrical charge to the muscle wire 680, such as illustrated from power source 660, to provide electrical energy to heat the muscle wire 680 and activate the contraction of the muscle wire. In some embodiments, the vent activator controls the application of the electrical charge to the muscle wire 680. In some embodiments, the vent activator 690 may be cooling controller or processor, which may be separate element, such as a cooling controller or similar element, or may be a general-purpose processor, such as processor 610, to control the application of electrical charge to the muscle wire 680. In some embodiments, the vent activator 690 applies an electrical charge to the muscle wire 680 upon an event to trigger application of the electrical energy to activate the muscle wire. In some embodiments, the apparatus 600 may include a heat sensor 692, wherein the heat sensor 692 sensing a temperature at or above a certain temperature threshold may be an event to trigger the application of the electrical energy to the muscle wire 680. However, embodiments are not limited to a particular event resulting to the application of electrical energy to the muscle wire. In another embodiment, the apparatus 600 may anticipate the need for additional cooling, and may cause the opening of the vent 675 when an event occurs indicating that the apparatus 600 has reached a certain operational level or when a certain component that generates a large amount of heat is enabled or operates at a certain capacity. In certain embodiments, the event may be the application of power to the apparatus such that the vent 675 is opened by the activation of the muscle wire 680 when the apparatus 600 is turned on, such as, for example, for an apparatus that generates heat quickly and requires full venting when the apparatus is operating.

In some embodiments, the vent activator 690 may cease the application of an electrical charge to the muscle wire 680 upon a second event to trigger allowing the vent 675 to close. In some embodiments, the second event may be the apparatus 600 falling to a certain temperature, such as a temperature sensed by the heat sensor being at or below a second threshold temperature, where the second threshold temperature may be different than the first threshold temperature. In some embodiments, the second event may be a reduction in an operational level of the apparatus 600, or turning off the apparatus 600.

In some embodiments, the apparatus 600 may further include the following:

The apparatus includes certain components, with examples illustrated in FIG. 6. However, embodiments are not limited to the examples illustrated in FIG. 6, and may include other components that produce sufficient heat to activate the muscle wire 680. Under some embodiments, the apparatus 600 includes an interconnect or crossbar 605 or other communication means for transmission of data. The apparatus 600 may include a processing means such as the one or more processors 610 coupled with the interconnect 605 for processing information. The processors 610 may comprise one or more physical processors and may include one or more logical processors. The interconnect 605 is illustrated as a single interconnect for simplicity, but may represent multiple different interconnects or buses and the component connections to such interconnects may vary. The interconnect 605 shown in FIG. 6 is an abstraction that represents any one or more separate physical buses, point-to-point connections, or both connected by appropriate bridges, adapters, or controllers.

In some embodiments, the apparatus 600 further comprises a random access memory (RAM) or other dynamic storage device or element as a main memory and other memory (including memory buffers) 615 for storing information and instructions to be executed by the processors 610. RAM memory includes dynamic random access memory (DRAM), which requires refreshing of memory contents, and static random access memory (SRAM), which does not require refreshing contents, but at increased cost. DRAM memory may include synchronous dynamic random access memory (SDRAM), which includes a clock signal to control signals, and extended data-out dynamic random access memory (EDO DRAM). The apparatus 600 may include one or more non-volatile memory elements 625, including, for example, flash memory, for the storage of certain elements. The apparatus 600 also may comprise a read only memory (ROM) 630 or other static storage device for storing static information and instructions for the processors 610.

Data storage 635 may also be coupled to the interconnect 605 of the apparatus 600 for storing information and instructions. The data storage 635 may include a magnetic disk, a solid-state drive, an optical disc and its corresponding drive, or other memory device. Such elements may be combined together or may be separate components, and utilize parts of other elements of the apparatus 600.

One or more transmitters or receivers 640 may also be coupled to the interconnect 805. In some embodiments, the apparatus 600 may include one or more ports 645 for the reception or transmission of data. The apparatus 600 may further include one or more antennas 642 for the transmission and reception of data via radio signals.

In some embodiments, the apparatus 600 includes one or more input devices 650 for the input of data, including hard and soft buttons, a joy stick, a mouse or other pointing device, voice command system, or gesture recognition system. In some embodiments, the apparatus includes an output display 655, where the display 655 may include a liquid crystal display (LCD) or any other display technology, for displaying information or content to a user. In some environments, the display 655 may include a touch-screen that is also utilized as at least a part of an input device 650. In some environments, the display 655 may include an audio device, such as a speaker for providing audio information.

The apparatus 600 may also comprise a power source 660, which may comprise a power supply, a battery, a solar cell, a fuel cell, or other system or device for providing or generating power. The power provided by the power source 660 may be distributed as required to elements of the apparatus 600, including, for example, the application of electrical charge to the muscle wire 680 to activate one or more vents 675.

Figure 7:
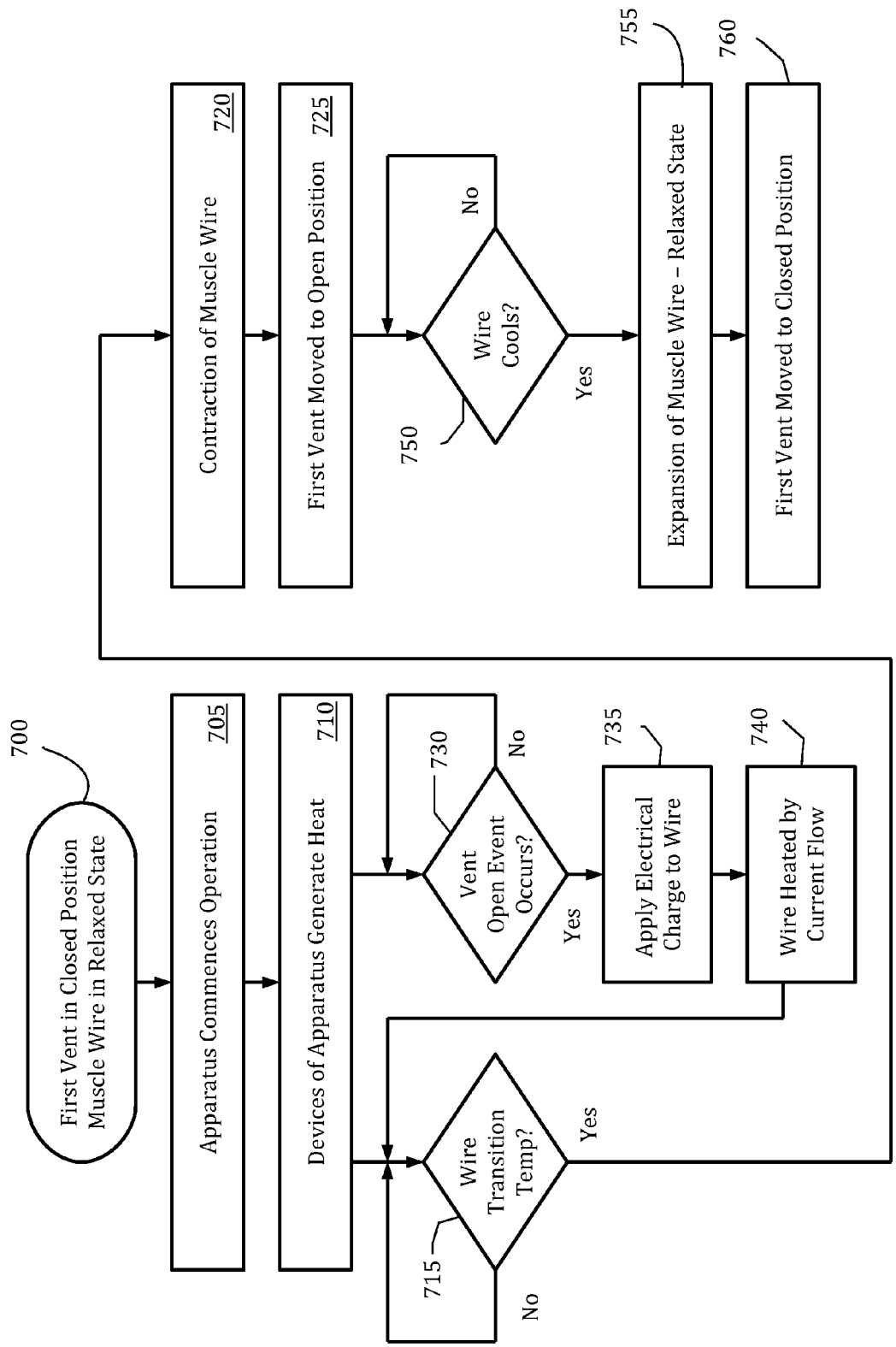
FIG. 7 is a flow chart to illustrate a process for thermal activation of vents according to an embodiment.

FIG. 7 is a flow chart to illustrate a process for thermal activation of vents according to an embodiment. In some embodiments, an electronic device has one or more vents including a first vent that is initially in a closed position 700, wherein the first vent includes a connection to a muscle wire, such as illustrated in, for example, FIGS. 2 through 6, where the muscle wire is initially in a relaxed state. The electronic device may commence operation 705, and one or more heat generating devices may begin generating heat 710. In some embodiments, upon the muscle wire reaching a transition temperature 715 the muscle wire contracts 720. The contraction of the muscle wire results in applying force to the first vent and moving the first vent to an open position 725.

In some embodiments, a process may alternately or in addition include activating the muscle wire to open the first vent upon occurrence of an event 730, wherein the event may include, for example, a temperature of the apparatus reaching a certain threshold or an operation of the apparatus entering a certain state. Upon the occurrence of the event to trigger activation of the muscle wire, an electrical charge is applied to the muscle wire 735 and the muscle wire is thus heated by the current flow 740, and, upon reaching the transition temperature 715, this results in the contraction of the muscle wire 720 and the moving the first vent to the open position.

In some embodiments, upon the muscle wire cooling sufficiently 750, the muscle wire expands and returns to the relaxed state 755, and the vent returns to a closed position 760. In some embodiments, the vent is pulled back to the closed position by a spring or other tension device. In some embodiments, the cooling of the wire results from a cessation of the application of the electrical charge 735, wherein the cessation of the activation of the electrical charge may be in response to a second event to allow the closing of the vent, the event being, for example, detecting a reduced temperature in the apparatus, a reduction in operation of the apparatus, or the switching of power to the apparatus off.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, an apparatus includes: a vent having a first position and a second position, where the first position is an open position and the second position is a closed position; a muscle wire, a first end of the muscle wire being coupled with a connection to the vent and a second end of the muscle wire being coupled with an anchor point; and a tension element, a first end of the tension element being coupled with the vent at a connection point. In some embodiments, the muscle wire is to apply a force to the vent to move the vent to the open position upon the muscle wire entering a contracted state, and the tension element pulling the vent to the closed position upon the muscle wire entering a relaxed state.

In some embodiments, the muscle wire is to enter the contracted state upon reaching a transition temperature for the muscle wire.

In some embodiments, the muscle wire is in contact with or in close proximity to a heat source.

In some embodiments, the muscle wire includes a nickel titanium alloy.

In some embodiments, the apparatus further includes an electrical connection to the muscle wire. In some embodiments, the apparatus is to apply an electrical charge to the muscle wire via the electrical connection to move the vent to the open position.

In some embodiments, the tension element is a spring.

In some embodiments, the vent is a circular vent, and the tension element is a mainspring.

In some embodiments, the vent includes a vent cover, the vent cover being moved to open one or more vent openings in the open position. In some embodiments, the vent cover includes one or more louvers.

In some embodiments, the apparatus includes a second muscle wire coupled with the vent.

In some embodiments, the apparatus further includes a pulley, the muscle wire being re-directed by the pulley.

In some embodiments, a method includes: activating an apparatus, the apparatus including one or more heat sources and a first vent coupled to a muscle wire, the muscle wire being initially in a relaxed state and the first vent being initially in a closed position; applying a force to the first vent by the muscle wire in response to the muscle wire transitioning to a contracted state in response to heating of the muscle wire; and moving the first vent from the closed position to an open position in response to the force applied to the first vent by the muscle wire.

In some embodiments, the muscle wire transitions to the contracted state upon reaching a transition temperature.

In some embodiments, the method further includes: in response to an event to trigger opening of the first vent, applying an electrical charge to the muscle wire.

In some embodiments, the muscle wire reaching the transition temperature is in response to heat generated by current flowing through the muscle wire.

In some embodiments, the method further includes ceasing the application of the electrical charge.

In some embodiments, the ceasing of the application of the electrical charge is in response to a second event to allow closing of the first vent.

In some embodiments, the event is a temperature detected by a heat sensor reaching a certain threshold.

In some embodiments, the event is an operational level for the apparatus.

In some embodiments, the method further includes moving the first vent from the open position to the closed position in response to cooling of the muscle wire, the muscle wire transitioning to the relaxed state. In some embodiments, moving the first vent from the open position to the closed position includes the first vent being pulled by a tension element.

In some embodiments, a system includes: a first vent, the first vent being moveable to an open position and a closed position; a thermally actuated vent mechanism including a muscle wire, a first end of the muscle wire being coupled with a connection to the first vent and a second end of the muscle wire being coupled with an anchor point, and a tension element, a first end of the tension element being coupled with the first vent at a connection point; and a vent activator to provide energy to activate the muscle wire. In some embodiments, the muscle wire is to apply a force to the first vent to move the vent to the open position upon the muscle wire entering a contracted state, and the tension element pulling the vent to the closed position upon the muscle wire entering a relaxed state.

In some embodiments, the muscle wire is to enter the contracted state upon reaching a transition temperature for the muscle wire.

In some embodiments, the muscle wire includes a nickel titanium alloy.

In some embodiments, the vent activator to activate the muscle wire is a heat source that provides thermal energy to the muscle wire. In some embodiments, the vent activator is an electronic device that produces heat in operation. In some embodiments, the vent activator is a processor, and wherein the thermal energy is produced by the operation of the processor. In some embodiments, the vent processor is a memory, wherein the thermal energy is produced by the operation of the memory.

In some embodiments, the system further includes an electrical connection to the muscle wire. In some embodiments, the vent activator is to direct an electrical charge to the muscle wire via the electrical connection to move the vent to the open position. In some embodiments, the application of the electrical charge to the muscle wire by the vent activator is in response to an event triggering activation of the muscle wire.

In some embodiments, the system further includes a heat sensor, and wherein the event includes the heat sensor sensing a temperature that is at or above a threshold temperature.

In some embodiments, the system is to apply the electrical charge upon the system reaching a certain operational level.

In some embodiments, the system further includes an electrical component, wherein the event includes detection of an operational state of the electrical component.

In some embodiments, the system further includes a cooling controller, the cooling controller controlling the application of the electrical charge to the muscle wire.

In some embodiments, the event to trigger activation of the muscle wire is an operation to turn on the system.

In some embodiments, the system is to cease application of the electrical charge upon the occurrence of an event to trigger allowing the vent to close.

In some embodiments, a non-transitory computer-readable storage medium includes data stored thereon representing sequences of instructions that, when executed by a processor, cause the processor to perform operations comprising: activating an apparatus, the apparatus including one or more heat sources and a first vent coupled to a muscle wire, the muscle wire being initially in a relaxed state and the first vent being initially in a closed position; and, upon occurrence of an event, applying an electrical charge to the muscle wire to activate contraction of the muscle wire, wherein the muscle wire applies a force to the first vent in response to the muscle wire transitioning to a contracted state and moves the first vent from the closed position to an open position by the application of force to the first vent by the muscle wire.

What is claimed is:

1. An apparatus comprising:
 a vent having a first position and a second position, wherein the first position is an open position and the second position is a closed position;
 a muscle wire, a first end of the muscle wire being coupled with a connection to the vent and a second end of the muscle wire being coupled with an anchor point;
 an electrical connection to the muscle wire; and
 a tension element, a first end of the tension element being coupled with the vent at a connection point;
 wherein the muscle wire is to apply a force to the vent to move the vent to the open position upon the muscle wire entering a contracted state, and the tension element pulling the vent to the closed position upon the muscle wire entering a relaxed state.

2. The apparatus of claim 1, wherein the muscle wire is to enter the contracted state upon reaching a transition temperature for the muscle wire.

3. The apparatus of claim 1, wherein the muscle wire is in contact with or in close proximity to a heat source.

4. The apparatus of claim 1, wherein the muscle wire includes a nickel titanium alloy.

5. The apparatus of claim 1, wherein the apparatus is to apply an electrical charge to the muscle wire via the electrical connection to move the vent to the open position.

6. The apparatus of claim 1, wherein the tension element is a spring.

7. The apparatus of claim 1, wherein the vent includes a vent cover, the vent cover being moved to open one or more vent openings in the open position.

8. The apparatus of claim 7, wherein the vent cover includes one or more louvers.

9. A method comprising:
activating an apparatus, the apparatus including one or more heat sources and a first vent coupled to a muscle wire, the muscle wire being initially in a relaxed state and the first vent being initially in a closed position;
applying a force to the first vent by the muscle wire in response to the muscle wire transitioning to a contracted state in response to heating of the muscle wire; and
moving the first vent from the closed position to an open position in response to the force applied to the first vent by the muscle wire.

10. The method of claim 9, wherein the muscle wire transitions to the contracted state upon reaching a transition temperature.

11. The method of claim 10, further comprising:
in response to an event to trigger opening of the first vent, applying an electrical charge to the muscle wire.

12. The method of claim 11, wherein the muscle wire reaching the transition temperature is in response to heat generated by current flowing through the muscle wire.

13. The method of claim 11, further comprising ceasing the application of the electrical charge.

14. The method of claim 13, wherein the ceasing of the application of the electrical charge is in response to a second event to allow closing of the first vent.

15. The method of claim 9, further comprising moving the first vent from the open position to the closed position in response to cooling of the muscle wire, the muscle wire transitioning to the relaxed state.

16. The method of claim 15, wherein moving the first vent from the open position to the closed position includes the first vent being pulled by a tension element.

17. A system comprising:
a first vent, the first vent being moveable to an open position and a closed position;
a thermally actuated vent mechanism including:
a muscle wire, a first end of the muscle wire being coupled with a connection to the first vent and a second end of the muscle wire being coupled with an anchor point, and
a tension element, a first end of the tension element being coupled with the first vent at a connection point; and
a vent activator to provide energy to activate the muscle wire;
wherein the muscle wire is to apply a force to the first vent to move the vent to the open position upon the muscle wire entering a contracted state, and the tension element pulling the vent to the closed position upon the muscle wire entering a relaxed state.

18. The system of claim 17, wherein the vent activator to activate the muscle wire is a heat source that provides thermal energy to the muscle wire.

19. The system of claim 18, wherein the vent activator is an electronic device that produces heat in operation.

20. The system of claim 19, wherein the vent activator is a processor, wherein the thermal energy is produced by the operation of the processor.

21. The system of claim 17, further comprising an electrical connection to the muscle wire, wherein the vent activator is to direct an electrical charge to the muscle wire via the electrical connection to move the vent to the open position.

22. The system of claim 21, wherein the application of the electrical charge to the muscle wire by the vent activator is in response to an event triggering activation of the muscle wire.

23. The system of claim 22, further comprising a heat sensor, wherein the event includes the heat sensor sensing a temperature that is at or above a threshold temperature.

24. The system of claim 22, further comprising an electrical component, wherein the event includes detection of an operational state of the electrical component.

* * * * *